US006861363B2

(12) United States Patent
Harchanko et al.

(10) Patent No.: US 6,861,363 B2
(45) Date of Patent: Mar. 1, 2005

(54) METHOD OF MAKING MULTILEVEL MEMS STRUCTURES

(75) Inventors: John S. Harchanko, New Market, AL (US); Michael Whitley, Madison, AL (US)

(73) Assignee: Mems Optical, Inc., Huntsville, AL (US)

( * ) Notice: Subject to any disclaimer, the term of this patent is extended or adjusted under 35 U.S.C. 154(b) by 182 days.

(21) Appl. No.: 10/209,918

(22) Filed: Aug. 2, 2002

(65) Prior Publication Data

US 2004/0023498 A1 Feb. 5, 2004

(51) Int. Cl.[7] ............................................. H01L 21/302
(52) U.S. Cl. ...................................... 438/706; 438/725
(58) Field of Search .................................. 438/706, 710, 438/714, 719, 720, 723, 724, 725

(56) References Cited

U.S. PATENT DOCUMENTS

| | | | | |
|---|---|---|---|---|
| 4,284,712 A | * | 8/1981 | James ......................... | 430/312 |
| 4,689,113 A | * | 8/1987 | Balasubramanyam et al. ........................... | 438/631 |
| 4,859,573 A | * | 8/1989 | Maheras et al. ............ | 430/326 |
| 5,286,607 A | * | 2/1994 | Brown ........................ | 430/313 |
| 6,156,665 A | * | 12/2000 | Hamm et al. ............... | 438/706 |

* cited by examiner

Primary Examiner—Kin-Chan Chen

(57) ABSTRACT

Multi-levels are etched into silicon. The levels are etched through a combination of crosslinking photoresist, multiple photoresist patterning and development, wet etching and/or dry-etching. RIE, DRIE, and other etch techniques can be used during different steps. The multilevel structure may thereby be produced at commercially acceptable production rates allowing the method of the present application to be used in volume production of multilevel structures.

21 Claims, 5 Drawing Sheets

METHOD OF MAKING MULTILEVEL MEMS STRUCTURES

FIELD OF THE INVENTION

The present invention relates to forming micro electromechanical (MEMS) structures. In particular, the present invention is related to forming multi-level MEMS structures using a combination of Crosslinking Resist, and etching techniques.

BACKGROUND OF THE INVENTION

There is a need for MEMS structures of multiple levels in many applications. Micro machines such as micro waveguides, microgears, micro-field emitters, and other micro-scale or meso-scale machines require precision multi-level etched structures.

There are several methods to build multi-level MEMS structures and they basically fall into two methods. The first method adds levels, the second method removes levels, to obtain the desired structure. Adding levels has disadvantages. If precision is desired, which it often is or MEMS would not be used, the alignment of the levels is crucial. Bonding of the levels, when adding levels, often forms non-uniform bonding spots and voids. Voids are either extrinsic (created by particles or trapped air) or intrinsic (formed during the bonding process). Instead of bonding layers sometimes alignment is accomplished via micro-etched pegs, which require accurate peg and hole placement. Subtracting layers to achieve multiple levels, e.g., by plasma etching techniques, often results in overetching and etching in undesired regions. Hence, there are problems with each method.

One method for creating multiple layers uses a combination of removing and adding layers. Such a method is described in U.S. Pat. No. 6,082,208 to Rodgers et al. In this method a three dimensional element (in this case a MEMS transmission gear set) is micro-machined. The surface micromachining processes are based on steps for depositing and photolithographically patterning alternate layers of silicon and sacrificial material. The steps build up the layer structure of the MEM apparatus (col. 4 lines 52–63). The disadvantage is the complexity of etching and depositing processes needed to build the multi-level structure, the bonding of one layer to the next, and the low speed of manufacture.

One method of removing layers to create multi-level structures in silicon, involves the use of lasers. The process is called Laser-Driven Vapor-Phase Etching (LACE) and can be used to etch multi-level steps to an etch accuracy of a few $\mu m^3$. The process works by using a laser to selectively drive chemical reactions for dry etching semiconductors. The laser (e.g., 500 nm for $Cl_2$ chamber gas) locally heats the substrate (e.g., Si, aiding in etching) and produces free radicals (e.g., Cl*) locally in the chamber gas. The free radicals etch the substrate at the location of beam by essentially bonding with the substrate material in a gaseous form (e.g., $SiCl_4$). The process can be used to make holes, channels and other complicated structures. One of the disadvantages is that LACE is not a parallel process, the complete substrate is not etched at the same time, only local etching occurs. Thus LACE is not fast enough for most manufacturing applications.

A current method for etching single structures fast and accurately is the DRIE method displayed in FIGS. 1A–1E. The DRIE method permits an etching rate of between 2 and 20 $\mu m/min$ and a polymer layer, for example an approximately 50 nm thick TEFLON-like polymer (polytetrafluoroethylene-like polymer) layer. The polymerization step can be performed using a mixture of Ar and $CHF_3$. The etching step can be performed for a sufficient duration to attain an etching depth of approximately 2–3 $\mu m$. The steps are repeated for desired depth.

Since the DRIE method may be used, as a part of the inventive process later described in the present application, it is described in more detail here. FIGS. 1A–1E display the essentials of the DRIE method of etching. DRIE is a method of anisotropic plasma etching to provide laterally defined recess structures through an etching mask employing a plasma and contact with a reactive etchant gas. The substrate to be etched 20 (FIG. 1A, e.g. silicon), is covered with photoresist 10, patterned and developed. A polymer coating 30 (FIG. 1B, e.g. $CHF_3$) is deposited above the resist 10 and the substrate 20. The system is dry-etched where the base coating is etched at a much larger rate than the vertical structures (Polymer 30 in FIG. 1C) resulting in anisotropic etched structures 40. The etching step and the polymerizing step can be repeated to provide high mask selectivity combined with a very high anisotropy of the etched structures.

The DRIE process is performed separately in separate, alternating sequential etching and polymerization steps. During the etching step, chemically active species and electrically charged particles (ions) are generated in the reactor with the aid of an electrical discharge in a mixture of sulfur hexafluoride ($SF_6$) and Ar. Subsequently a polymerization step is performed with a mix of, for example, trifluoromethane ($CHF_3$) and Ar. The etching and polymerization steps are repeated until the desired structure and etch depth is obtained. Typical polymerization and etching times are about 6 seconds.

The DRIE etch method and other methods like it are not conducive to etching multi-level structures.

The present invention relates to a method for forming multi-level structures that are etched, using a combination of techniques like the DRIE method, from a substrate layer. The process avoids bonding issues raised from layer buildup techniques and is conducive to relatively higher manufacturing speeds.

SUMMARY OF THE INVENTION

Using a combination of crosslinking photoresist, photoresist patterning, and ion etching, the inventors have discovered methods for the production of precise verticalized multi-level structures with production rates favoring manufacturing.

The invention, in part, allows a variation of the etching techniques during etching steps, with grayscale etching possibly being used in conjunction with DRIE and/or RIE (Reactive Ion Etching) techniques. DRIE, RIE, ICP-machining (Inductive Coupled Plasma), and grayscale may be used interchangeably depending on the structures desired.

BRIEF DESCRIPTION OF THE DRAWINGS

The accompanying drawings are included to provide a further understanding of the invention. The drawings illustrate embodiments of the invention and together with the description serve to explain the principles of the embodiments of the invention. The drawings are illustrative of and are not limitative of the present invention, and wherein.

DETAILED DESCRIPTION OF THE PREFERRED EMBODIMENTS

Advantages of the present invention will become more apparent from the detailed description given herein. However, it should be understood that the detailed description and specific examples, while indicating preferred embodiments of the invention, are given by way of illustration only, since various changes and modification within the spirit and scope of the invention will become apparent to those skilled in the art form this detailed description.

Figure 1A:
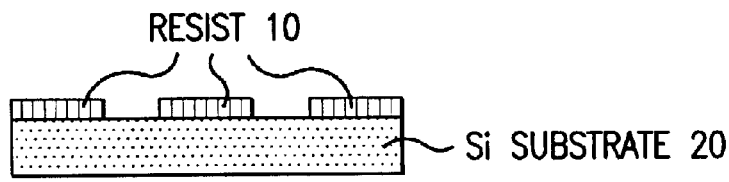
FIG. 1 is a diagram showing the traditional DRIE process of etching, using developed photoresist, plasma etching, polymer deposition, and re-etching to desired levels.
Figure 1B:
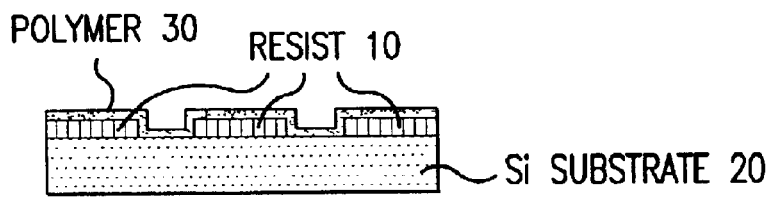
Figure 1C:
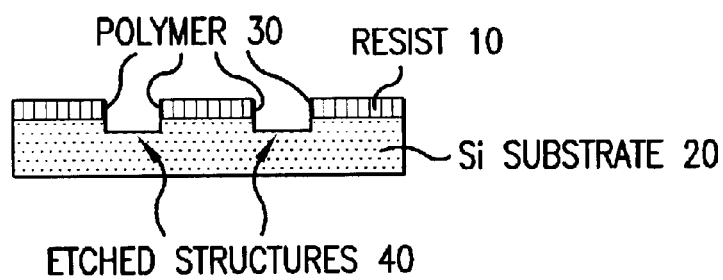
Figure 1D:
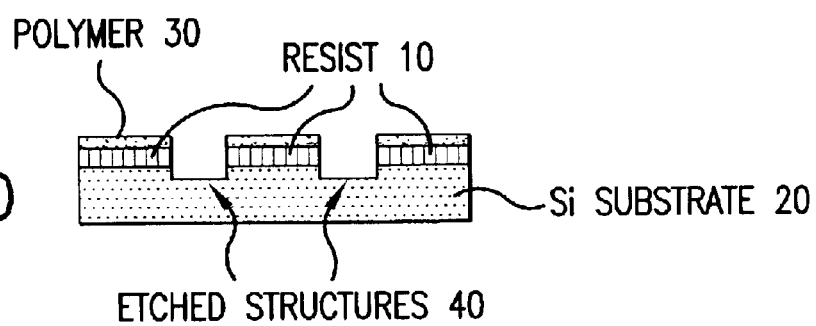
Figure 1E:
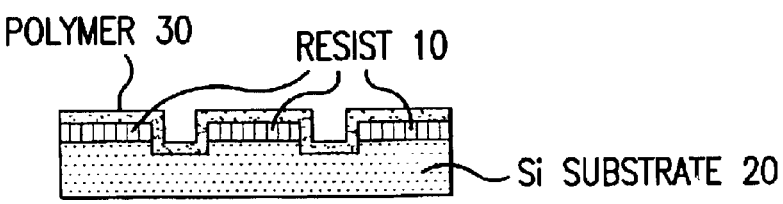
Figure 2A:
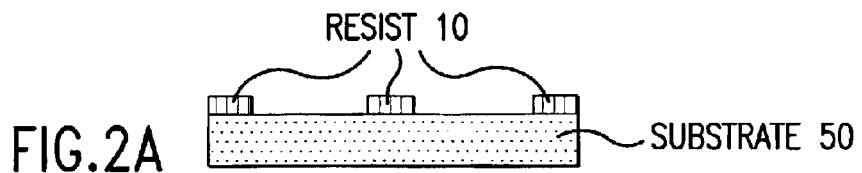
FIG. 2 is a diagram showing a first embodiment of the invention creating a 3 level structure, using developed photoresist, crosslinking photoresist, and plasma etching.
Figure 2B:
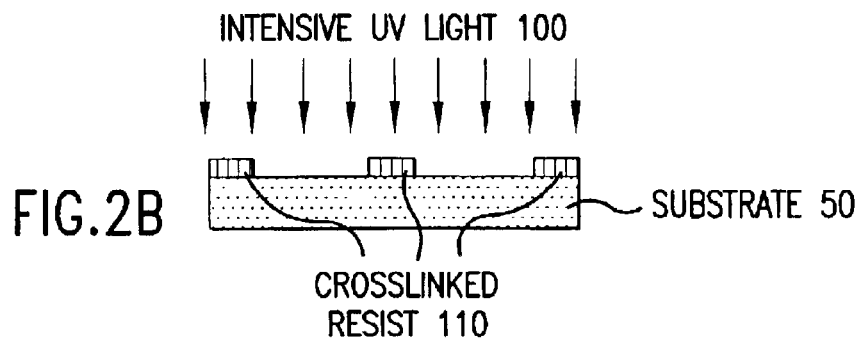
Figure 2C:
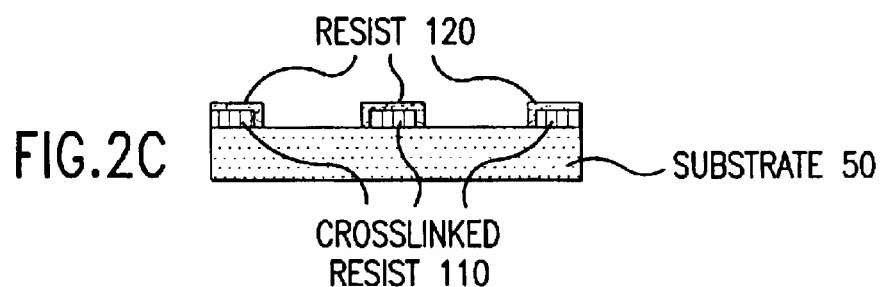
Figure 2D:
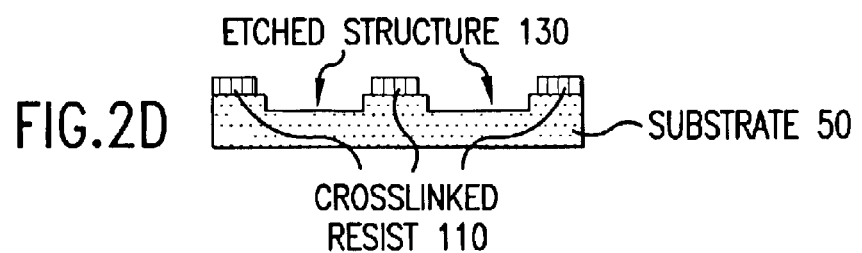
Figure 2E:
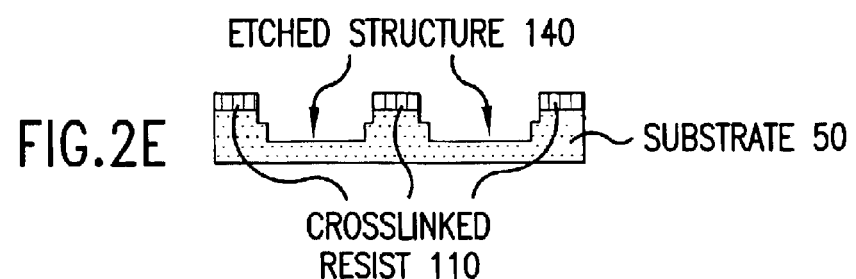
Figure 2F:
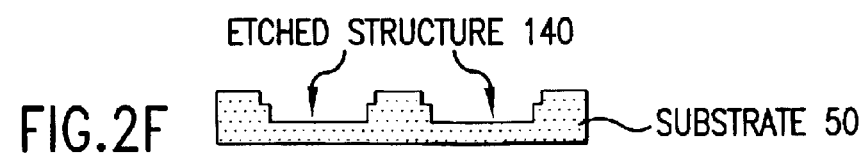

FIGS. 2A–2F display a preferred embodiment of the invention for etching 3 level MEMS structures. Substrate 50 (FIG. 2A, e.g., silicon), is coated with a photoresist which is patterned and developed 10. With the substrate 50 heated, using intense UV light 100, and chemicals (not shown), the resist 10 is crosslinked 110 making it resistant to etching (FIG. 2B). The crosslinked photoresist 110 is of the order of thickness of 1.5 micrometers. A second photoresist layer 120 is patterned and developed on the crosslinked photoresist 110 without affecting the crosslinked pattern (the undeveloped photoresist is removed e.g., by a standard solvent, FIG. 2C). The substrate 50 is etched (130, FIG. 2D) to a predetermined level then the remaining photoresist 120 is removed leaving the crosslinked photoresist 110. The substrate is etched again to a second predetermined level (140, FIG. 2E). The crosslinked photoresist 110 is removed without affecting the substrate 50 (e.g. Oxygen plasma or scrub with solvent) leaving behind a three level structure in the substrate.

Substrate Etching can be accomplished by RIE, DRIE, grayscale, ICP source methods or other suitable etching techniques. Other arrangements of the mentioned steps can achieve the same result and the discussion herein should not be interpreted to limit the order of the steps of the invention. It is also apparent that similar methods may be used to form an N level structure where N is greater than 4.

Figure 3A:
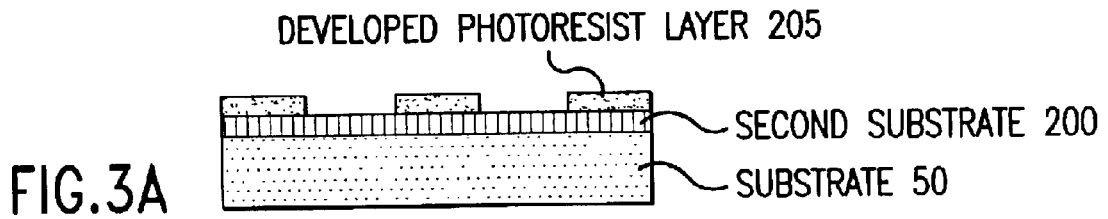
FIG. 3 is a diagram showing a second embodiment of the invention creating a 4 level structure, using a combination of developed photoresist, crosslinking photoresist, plasma and wet etching.
Figure 3B:
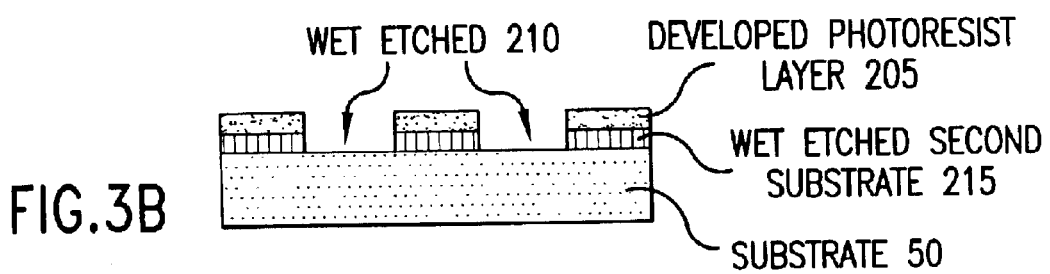
Figure 3C:
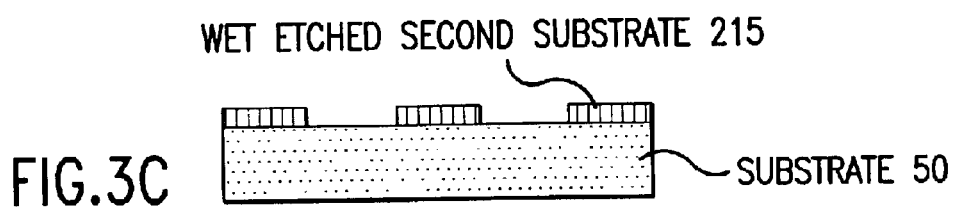
Figure 3D:
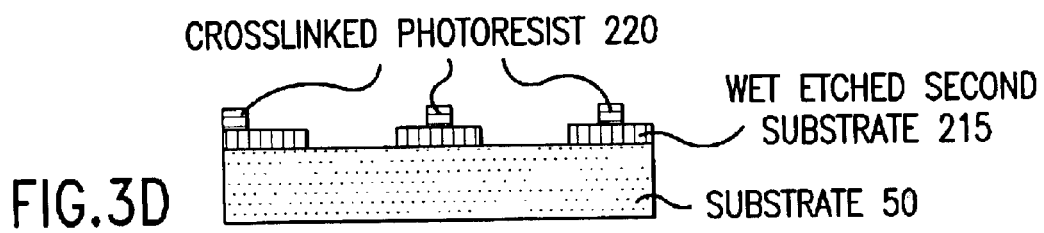
Figure 3E:
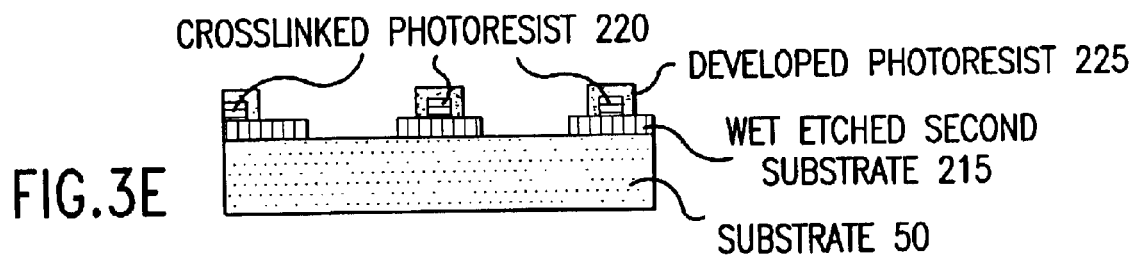
Figure 3F:
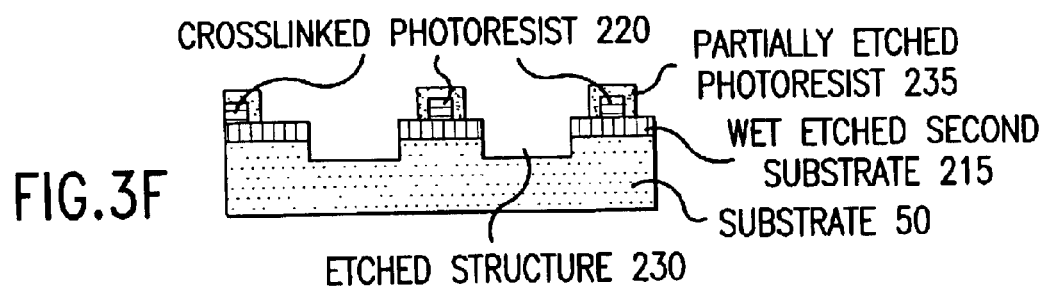
Figure 3G:
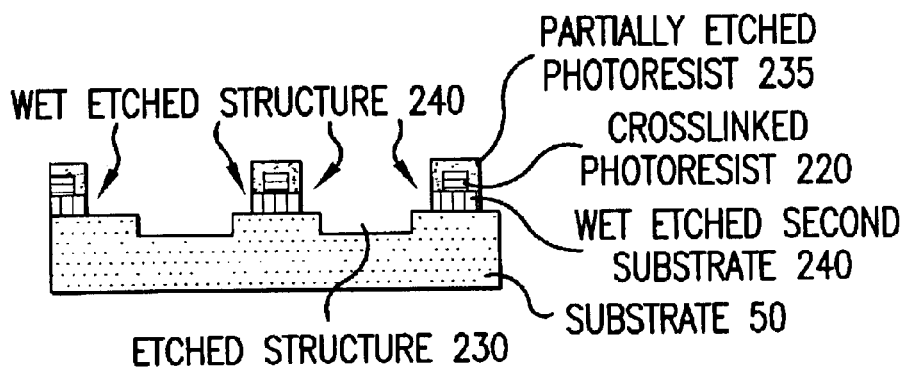
Figure 3H:
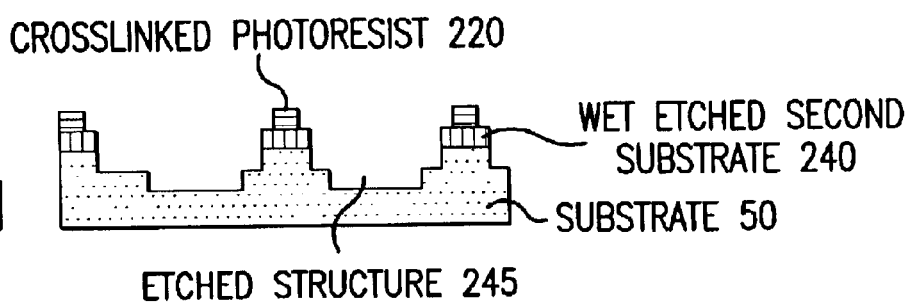
Figure 3I:
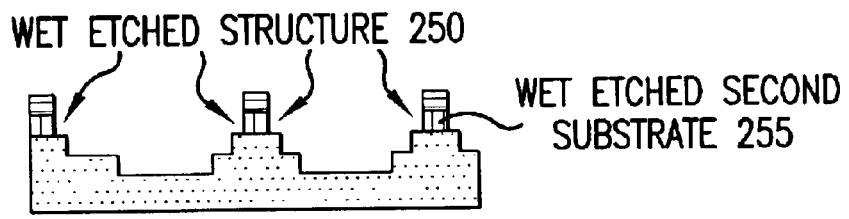
Figure 3J:
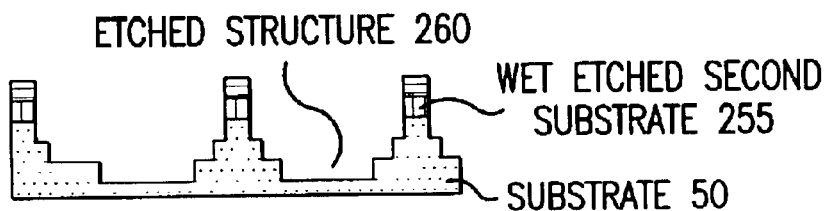
Figure 3K:
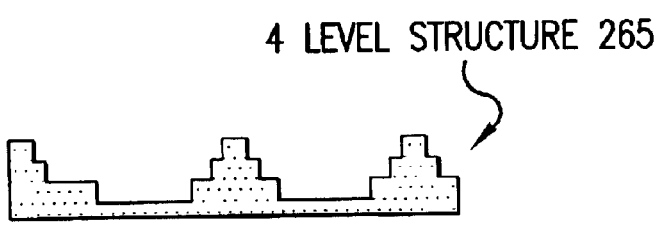

FIGS. 3A–3K display a preferred embodiment of the invention for etching 4 level MEMS structures. Substrate 50 (FIG. 3A, e.g. silicon) is coated with a second substrate 200 (e.g., $SiO_2$), which is amenable to wet etching. The second substrate 200 is coated with a photoresist which is patterned and developed 205 (FIG. 3A). The second substrate is wet-etched 215 resulting in a wet-etched structure 210 (FIG. 3B). The remaining photoresist is removed (FIG. 3C) and a new photoresist is patterned, developed and crosslinked 220 (FIG. 3D). A third photoresist 225 is patterned and developed (FIG. 3E) and the substrate dry-etched to a predetermined level resulting in an etched structure 230 (FIG. 3F). The previously wet etched second substrate 215 is wet-etched 240 (e.g., using $HF+H_2O$ for a $SiO_2$ second substrate) a predetermined amount (FIG. 3G) and the exposed substrate 50 is dry-etched to a another predetermined level forming etched structure 245 (FIG. 3H). The previously wet etched second level 240 is wet etched again 255 forming another etched structure 250 (FIG. 3I) and another dry-etch applied to the substrate 50 to another predetermined level forming etched structure 260 (FIG. 3J). The crosslinked resist 220 and the remaining second substrate are removed (e.g., by $O_2$ plasma and/or solvent) resulting in a 4-level MEMS structure 265 (FIG. 3K). Other organization of steps can achieve the same result for example the dry-etch displayed in FIG. 3F could occur before deposit, patterning and development of photoresist 225. Photoresist 225 needs to be developed and patterned before the wet-etch displayed in FIG. 3G. Other arrangements of the mentioned steps can achieve the same result and the discussion herein should not be interpreted to limit the order of the steps of the invention.

Figure 4A:
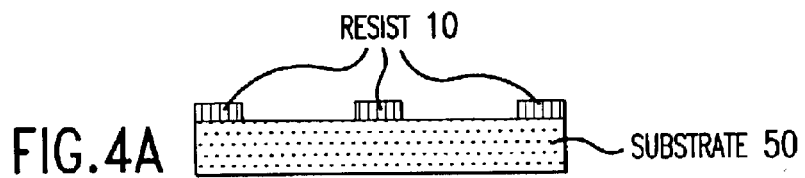
FIG. 4 is a diagram showing a third embodiment of the invention creating a multi-level structure with curved levels, using a combination of developed photoresist, crosslinking photoresist, plasma and grayscale etching.
Figure 4B:
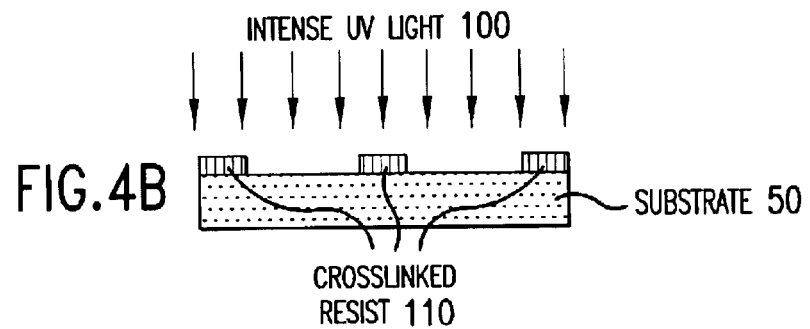
Figure 4C:
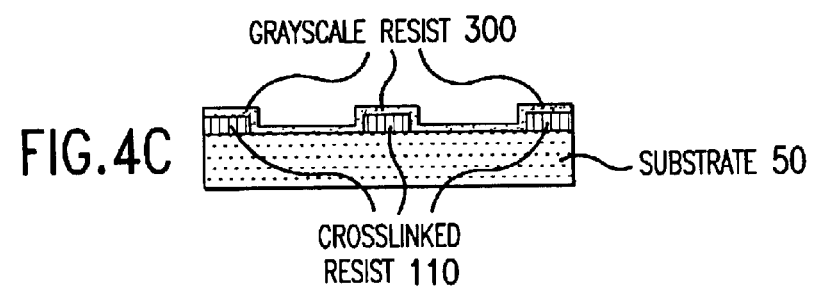
Figure 4D:
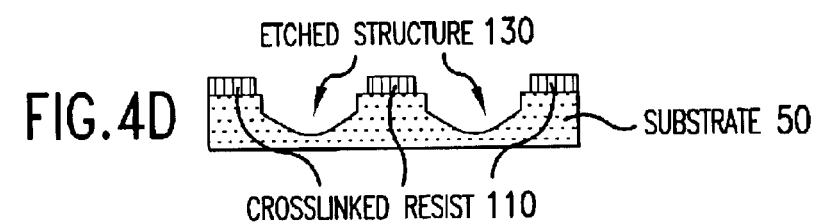
Figure 4E:
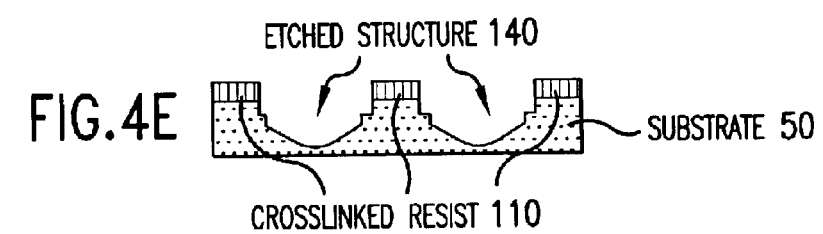
Figure 4F:
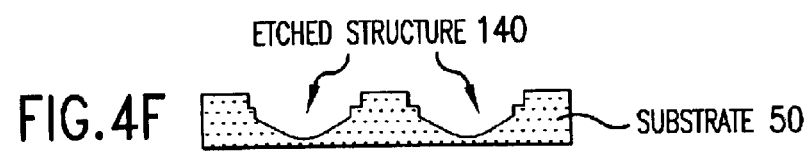

FIGS. 4A–4F display a third embodiment of the invention similar to the embodiment shown in FIGS. 2A–2F where grayscale etching has been used to form a grayscale resist 300 (FIG. 4C) to create an etched structure 130 that is curved (FIG. 4D). The steps shown in FIGS. 4A, 4B, 4D, 4E, and 4F correspond respectively with the steps shown in FIGS. 2A, 2B, 2D, 2E, and 2F, the difference is that grayscale etching has been used instead of RIE or DRIE etching. Replacement of grayscale etching with other dry etching processes in the embodiments shown in FIGS. 3A–3K and FIGS. 2A–2F, will also result in multi-level structures that combine curved surfaces and/or step structures. Other combinations of grayscale etching, dry etching, and wet etching may be combined to form other multi-level structures that combine step and curved surfaces, and the discussion herein should not be interpreted to limit the combination taken to achieve such structures.

In an embodiment of the invention, a thin film of photoresist is applied to the substrate. One method of applying photoresist entails placing a drop of liquid photoresist onto a silicon wafer, then rapidly spinning the wafer to achieve a uniform thin coating of photoresist on the surface of the substrate. The photoresist is then exposed to ultraviolet light through a mask. The photoresist is then developed using known methods to produce an impression of the desired workpiece in the photoresist layer. The developed photoresist is then treated with a dry-etching process involving RIE, DRIE, ICP source methods, grayscale or other suitable Ion etching techniques. Other suitable etching methods may be substituted and the discussion herein should not be interpreted to limit the invention.

The photoresist can be a positive or negative photoresist. The positive photoresist material can be a novalak or phenyl-formaldehyde resin. The negative photoresist materiel can be a polyimide. Epoxy based negative resists have been used in MEMS processing. The preferred photoresist is a positive novalak photoresist. The specific type of photoresist is selected for, among other characteristics, the desired depth of the photoresist layer. The photoresist layer can be from 1 $\mu$m to 40 $\mu$m in thickness. Other suitable materials may be substituted and the discussion herein should not be interpreted to limit the invention.

The substrate material is preferably silicon. However, the substrate may be selected from any number of materials, for example, silicon, Ge, GaAs, GaSb, plastic, glass, quartz or metals such Cu, Al, InSb, InAs, InP, CdTe, and PbTe. Other suitable materials may be substituted and the discussion herein should not be interpreted to limit the invention.

Wet etching uses chemicals to etch particular exposed substrate materials and dry etching uses plasmas. Generally, dry etching will etch any exposed surface whereas wet etching only etches surfaces with which the chemicals react. Dry etching tends to be anisotropic or have unidirectional etching properties, whereas wet etching tends to be isotropic or etch any exposed material, with some difference in etch rate depending on crystal structure.

The wet etchant used depends upon the second substrate material. If $SiO_2$ is used for the second substrate material then $HF+H_2O$ is a preferred wet etchant to use. If the second substrate is Si then a preferred wet etchant is "HNA", a mixture of hydrofluric acid (HF), nitric acid ($HNO_3$), and acetic acid ($CH_3COOH$). Additional etch materials for various substrates that may be used in the present invention are shown in table 1. Other suitable materials may be substituted and the discussion herein should not be interpreted to limit the invention. TABLE 1: Comparison of wet and dry etchants and their etch rates in certain substrates.

| Etchants: | HNA (HF + $HNO_3$ + Acetic Acid) | Alkali-OH | EDP (ethylene-diamine pyro-chatechol) | TMAH (tetramethyl-ammonium hydroxide) | $XeF_2$ | DRIE Etching |
|---|---|---|---|---|---|---|
| Etch Type | wet | wet | wet | wet | dry | dry |
| Anisotropic? | no | yes | yes | yes | no | yes |
| Si Etch Rate $\mu$m/min | 1 to 3 | 1 to 2 | 0.02 to 1 | ≈1 | 1 to 3 | >1 |
| Nitride Etch | low | low | low | ≈1 nm/min | low | low |
| Oxide Etch nm/min | 10 to 30 | 1 to 10 | 1 to 80 | ≈1 | low | low |

The photoresist used for the crosslinked resist contains a base resin (e.g. $CH_2CHR$) which may be chemically and UV treated to form a resist having a high dry etch resistance. Other suitable materials may be substituted and the discussion herein should not be interpreted to limit the invention.

Other combinations of the invention pertain to a method to etch verticalized multi-level structures, which may include coating a substrate with a photoresist, patterning the photoresist, crosslinking the photoresist to produce a photomask, developing the crosslinked photoresist, coating the substrate and crosslinked resist with another layer of photoresist, patterning the second photoresist, developing the second photoresist, and etching the substrate.

Other combinations of the invention pertain to a method to etch verticalized multi-level structures, which may include coating a substrate with a second substrate (e.g. $SiO_2$), a photoresist, patterning the photoresist, developing the photoresist to produce a photomask, wet etching (e.g. with HF) to remove portions of the second substrate, removing the photoresist layer, laying a new photoresist, patterning the new photoresist, crosslinking the new photoresist to produce a photomask, developing the crosslinked photoresist, coating the substrates and crosslinked resist with another layer of photoresist, patterning the photoresist, developing the photoresist, etching the substrate using dry-etching techniques, wet etching the exposed second substrate (e.g. HF), etching the substrate using dry-etching techniques, removal of the non-crosslinked resist (e.g. by Acetone), wet etching the exposed second substrate (e.g. HF), etching the substrate using dry-etching techniques, removal of crosslinked resist (e.g. by Oxygen plasma) and wet etching remaining second substrate (e.g. by HF).

It should be apparent from the present specification that the invention of the present application may be modified as would occur to one of ordinary skill in the art. The scope of the present invention is apparent from the appended claims.

We claim:
1. A method of etching a multi-level structure into a substrate comprising:
   providing a patterned and developed first photoresist on the substrate;
   crosslinking the patterned and developed first photoresist;
   coating said first photoresist and said substrate with a patterned and developed second photoresist;
   etching said substrate to a first predetermined level, wherein said second photoresist is substantially removed; and
   etching said substrate to a second predetermined level wherein said first photoresist is substantially removed.
2. The method of claim 1 further comprising removing the remaining said second photoresist before etching said substrate to the second predetermined level.
3. The method of claim 2 further comprising removing the crosslinked said first photoresist.
4. A method of etching a multi-level structure comprising:
   providing a first substrate;
   coating the first substrate with a second substrate;
   coating said second substrate and with a patterned and developed first photoresist;
   etching said second substrate, wherein etching continues until said first substrate is exposed in desired locations and wherein said first substrate remains unetched by the etching;
   removing remaining said first photoresist;
   providing a patterned and developed second photoresist on said first substrate and said second substrate;
   crosslinking the patterned and developed second photoresist;
   coating said second photoresist and said second substrate with a patterned and developed third photoresist;
   etching by performing in order,
     etching said first substrate to a first predetermined level,
     etching said second substrate to a second predetermined level,
     etching said first substrate to a third predetermined level,
     etching said second substrate to a fourth predetermined level, and
     etching said first substrate to a fifth predetermined level; and
   removing said crosslinked said second photoresist, and remaining said second substrate.
5. The method according to claim 4, wherein said second substrate is $SiO_2$.

6. The method according to claim 4, wherein said second substrate etching uses wet etching.

7. The method according to claim 6, wherein said wet etching uses HF.

8. The method according to claim 1 or 4, wherein at least one substrate is silicon.

9. The method according to claim 1 or 4, wherein the photoresist is a positive novalak photoresist.

10. The method according to claim 1 or 4, wherein the photoresist is less than 20 $\mu$m thick.

11. The method according to claim 1 or 4, wherein the patterning is performed using ultraviolet light.

12. The method according to claim 1 or 4, wherein the RIE process is used as the etching process.

13. The method according to claim 1 or 4, wherein an ICP source based plasma etching process is used.

14. The method according to claim 13, wherein the ICP source uses a reactive etchant gas, where the reactive etchant gas comprises $SF_6$ and Ar.

15. The method according to claim 13, wherein the plasma etching process is accompanied by ion bombardment with energies between 5 and 30 eV.

16. The method according to claim 13, wherein the reactive ion etching is performed at a power of up to 300 watts at 30 KHZ.

17. The method according to claim 13, wherein the reactive ion etching is performed using a gas mixture, wherein said mixture is $CF_4$ and $O_2$, $CHF_4$ and $O_2$, or $SF_6$ and $O_2$.

18. The method according to claim 1 or 4, wherein the DRIE plasma etching or process is used as the etching process.

19. The method according to claim 18, wherein the polymer former for the DRIE process comprises $CF_3$ or $CHF_3$ or polytetrafluoroethylene.

20. The method according to claim 18, wherein the plasma etching process is accompanied by ion bombardment with energies between 5 and 30 eV.

21. The method according to claim 1 or 4, wherein the grayscale process is used as the etching process.

* * * * *